(12) United States Patent
Song et al.

(10) Patent No.: US 11,231,465 B2
(45) Date of Patent: Jan. 25, 2022

(54) DEVICE AND METHOD FOR CONTROLLING DISCHARGE BASED ON SLOPE OF THE DISCHARGE PROFILE

(71) Applicant: LG CHEM, LTD., Seoul (KR)

(72) Inventors: Jun Hyuk Song, Daejeon (KR); Suk In Noh, Daejeon (KR); Eun Kyung Kim, Daejeon (KR); Joo Sung Lee, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 238 days.

(21) Appl. No.: 16/486,083

(22) PCT Filed: Jan. 23, 2018

(86) PCT No.: PCT/KR2018/001022
§ 371 (c)(1),
(2) Date: Aug. 14, 2019

(87) PCT Pub. No.: WO2018/199437
PCT Pub. Date: Nov. 1, 2018

(65) Prior Publication Data
US 2020/0191872 A1 Jun. 18, 2020

(30) Foreign Application Priority Data

Apr. 28, 2017 (KR) .................. 10-2017-0055259

(51) Int. Cl.
*H02J 7/00* (2006.01)
*G01R 31/382* (2019.01)
(Continued)

(52) U.S. Cl.
CPC .......... *G01R 31/382* (2019.01); *G01R 31/36* (2013.01); *H01M 10/44* (2013.01); *H02J 7/005* (2020.01);
(Continued)

(58) Field of Classification Search
CPC .. G01R 31/382; G01R 31/3648; G01R 31/36; H02J 7/0048; H02J 7/0032;
(Continued)

(56) References Cited

U.S. PATENT DOCUMENTS 3,886,427 A * 5/1975 Long ................. H02J 7/027
320/156
4,560,937 A * 12/1985 Finger ............... G01R 31/3648
324/433

(Continued)

FOREIGN PATENT DOCUMENTS

CN 106443482 A * 2/2017
JP 05054275 A * 3/1993
(Continued)

OTHER PUBLICATIONS

International Search Report for PCT/KR2018/001022 (PCT/ISA/210) dated May 4, 2018, with English translation.
(Continued)

*Primary Examiner* — John T Trischler
(74) *Attorney, Agent, or Firm* — Birch, Stewart, Kolasch & Birch, LLP

(57) ABSTRACT

The present disclosure relates to a device and method for controlling discharge by calculating a slope of a discharge profile of a battery having a lithium-based cathode material and a silicon-based anode cell material, counting a frequency the slope is equal to or smaller than a preset slope value and adjusting a final discharge voltage in response to the counted frequency being above a predetermined frequency.

7 Claims, 5 Drawing Sheets

(51) Int. Cl.
   *H01M 10/44* (2006.01)
   *G01R 31/36* (2020.01)
   *G01R 31/392* (2019.01)

(52) U.S. Cl.
   CPC .......... *H02J 7/0032* (2013.01); *H02J 7/0048* (2020.01); *H02J 7/0063* (2013.01); *H02J 7/007184* (2020.01); *G01R 31/392* (2019.01); *H02J 7/00306* (2020.01)

(58) Field of Classification Search
   CPC .... H02J 7/007184; H02J 7/0063; H02J 7/005; H01M 10/44
   USPC .................................. 320/132, 134; 324/426
   See application file for complete search history.

(56) References Cited

U.S. PATENT DOCUMENTS

| | | | | |
|---|---|---|---|---|
| 5,117,324 A | * | 5/1992 | Johnson, Jr. | G06F 11/1441 361/66 |
| 5,185,566 A | * | 2/1993 | Goedken | H02J 7/007184 320/113 |
| 5,371,682 A | * | 12/1994 | Levine | G01R 31/3648 702/63 |
| 5,721,688 A | * | 2/1998 | Bramwell | H02J 7/00711 702/63 |
| 5,789,903 A | * | 8/1998 | Young | H02J 7/0069 320/161 |
| 5,869,970 A | * | 2/1999 | Palm | A61N 1/3708 324/433 |
| 6,208,116 B1 | * | 3/2001 | Fischedick | H02J 7/00047 320/125 |
| 6,211,654 B1 | * | 4/2001 | O'Sullivan | H02J 7/0047 320/149 |
| 6,366,054 B1 | * | 4/2002 | Hoenig | G01R 31/386 320/132 |
| 6,396,245 B1 | * | 5/2002 | Jeong | H02J 7/0031 320/132 |
| 6,646,845 B1 | * | 11/2003 | Turner | H02J 9/002 307/10.7 |
| 6,983,212 B2 | | 1/2006 | Burns | H02J 7/0019 320/106 |
| 7,646,171 B2 | * | 1/2010 | Mikhaylik | H01M 10/052 320/132 |
| 8,049,465 B2 | * | 11/2011 | Barsoukov | H01M 10/482 320/132 |
| 9,147,910 B2 | | 9/2015 | Chuah | H01M 10/486 |
| 9,263,908 B2 | * | 2/2016 | Ju | H02J 7/007 |
| 9,547,027 B2 | * | 1/2017 | Varma | G06F 1/3243 |
| 9,577,289 B2 | * | 2/2017 | Liao | H01M 4/131 |
| 9,716,291 B2 | * | 7/2017 | Mikhaylik | H01M 10/0569 |
| 9,787,106 B2 | * | 10/2017 | Maleki | H02J 7/00714 |
| 9,840,161 B2 | * | 12/2017 | Chikkannanavar | H02J 7/0063 |
| 9,847,550 B2 | * | 12/2017 | Scordilis-Kelley | H01M 10/052 |
| 9,859,588 B2 | | 1/2018 | Mikhaylik | H01M 10/0567 |
| 9,859,591 B2 | | 1/2018 | Hore | H01M 4/425 |
| 9,979,024 B2 | * | 5/2018 | Woo | H01M 10/0525 |
| 9,997,781 B2 | * | 6/2018 | Woo | H01M 4/366 |
| 10,126,367 B2 | * | 11/2018 | Lee | G01N 27/02 |
| 10,468,721 B2 | * | 11/2019 | Liao | H01M 4/525 |
| 10,507,734 B2 | * | 12/2019 | Oguma | G01R 31/389 |
| 10,536,017 B2 | * | 1/2020 | Tu | H02J 7/0063 |
| 10,601,026 B2 | * | 3/2020 | Song | H01M 4/0404 |
| 10,605,870 B2 | * | 3/2020 | Kim | H02J 7/045 |
| 10,627,448 B2 | * | 4/2020 | Koo | G01R 31/385 |
| 10,649,036 B2 | * | 5/2020 | Oguma | G01R 31/374 |
| 10,718,817 B2 | * | 7/2020 | Oguma | G01R 31/389 |
| 10,753,977 B2 | * | 8/2020 | Cha | G01R 31/3647 |
| 10,770,905 B2 | * | 9/2020 | Sugimoto | H02J 3/48 |
| 10,854,921 B2 | * | 12/2020 | Scordilis-Kelley | H01M 4/581 |
| 10,948,547 B2 | * | 3/2021 | Busser | G01R 31/3842 |
| 10,985,403 B2 | * | 4/2021 | Mikhaylik | H01M 10/052 |
| 2002/0130635 A1 | * | 9/2002 | Berlureau | G01R 31/389 320/118 |
| 2004/0108835 A1 | * | 6/2004 | Kim | H02J 7/0013 320/125 |
| 2006/0208701 A1 | | 9/2006 | Mikhaylik | |
| 2009/0099799 A1 | * | 4/2009 | Barsoukov | H01M 10/482 702/63 |
| 2010/0164430 A1 | * | 7/2010 | Lu | H01M 16/00 320/103 |
| 2012/0249082 A1 | | 10/2012 | Yamamoto et al. | |
| 2012/0253713 A1 | * | 10/2012 | Krajci | G01R 31/388 702/63 |
| 2013/0138370 A1 | * | 5/2013 | Oh | G01R 31/3842 702/63 |
| 2013/0169234 A1 | * | 7/2013 | Chuah | H01M 10/486 320/136 |
| 2013/0341923 A1 | | 12/2013 | Ju et al. | |
| 2014/0077769 A1 | * | 3/2014 | Maleki | H02J 7/0014 320/136 |
| 2014/0167656 A1 | * | 6/2014 | Yamada | G01R 31/3842 318/139 |
| 2015/0051855 A1 | * | 2/2015 | Joe | G01R 31/382 702/63 |
| 2015/0072237 A1 | * | 3/2015 | Woo | H01M 4/5825 429/219 |
| 2015/0072238 A1 | * | 3/2015 | Woo | H01M 4/366 429/219 |
| 2015/0115896 A1 | * | 4/2015 | Shimomura | H01M 4/131 320/136 |
| 2016/0013676 A1 | * | 1/2016 | Kaji | H02J 7/0068 320/134 |
| 2016/0111711 A1 | | 4/2016 | Yoshikawa et al. | |
| 2017/0059662 A1 | | 3/2017 | Cha et al. | |
| 2017/0084964 A1 | * | 3/2017 | Hore | H02J 7/0021 |
| 2017/0234930 A1 | * | 8/2017 | Lee | H01M 10/48 320/162 |
| 2017/0259687 A1 | * | 9/2017 | Chikkannanavar | B60L 58/12 |
| 2017/0350946 A1 | * | 12/2017 | Mukaitani | H01M 50/20 |
| 2018/0149701 A1 | * | 5/2018 | Koo | G01R 19/16542 |
| 2018/0156872 A1 | * | 6/2018 | Oguma | G01R 31/389 |
| 2018/0222344 A1 | * | 8/2018 | Oguma | B60L 11/1861 |
| 2018/0275201 A1 | * | 9/2018 | Oguma | G01R 31/392 |
| 2018/0292461 A1 | * | 10/2018 | Kim | G01R 31/36 |
| 2018/0342727 A1 | * | 11/2018 | Song | G01R 31/3865 |
| 2019/0123353 A1 | * | 4/2019 | Hirose | H01M 4/366 |
| 2019/0334352 A1 | * | 10/2019 | Sugimoto | H02J 3/32 |
| 2020/0003841 A1 | * | 1/2020 | Lim | G01R 31/3842 |
| 2020/0081068 A1 | * | 3/2020 | Kim | B60L 50/66 |
| 2020/0166579 A1 | * | 5/2020 | Busser | G01R 31/3648 |
| 2020/0209313 A1 | * | 7/2020 | Koo | G01R 31/36 |
| 2020/0243920 A1 | * | 7/2020 | Yoon | G01R 31/389 |
| 2020/0371161 A1 | * | 11/2020 | Gorlin | G01R 31/3842 |
| 2021/0041506 A1 | * | 2/2021 | Bae | G01R 31/392 |
| 2021/0048481 A1 | * | 2/2021 | Park | G01R 31/396 |
| 2021/0104782 A1 | * | 4/2021 | Park | H01M 10/441 |

FOREIGN PATENT DOCUMENTS

| | | |
|---|---|---|
| JP | 2009-530796 A | 8/2009 |
| JP | 4868556 B2 | 2/2012 |
| JP | 5345516 B2 | 11/2013 |
| JP | 2017-037748 A | 2/2017 |
| KR | 10-1999-0026944 A | 4/1999 |
| KR | 20110110652 A * | 10/2011 |
| KR | 10-2012-0112071 A | 10/2012 |
| KR | 10-2013-00204782 A | 2/2013 |
| KR | 10-1467741 B1 | 12/2014 |
| KR | 10-2015-0072409 A | 6/2015 |
| KR | 10-2016-0020426 A | 2/2016 |

(56) References Cited

FOREIGN PATENT DOCUMENTS

KR    10-2016-0039364 A    4/2016
KR    10-2016-0040326 A    4/2016

OTHER PUBLICATIONS

Extended European for European Patent Application No. 18791812.3 claiming priority to Korean Patent Application No. 10-2017-0055259 dated Dec. 19, 2019.

\* cited by examiner

【Fig. 1】
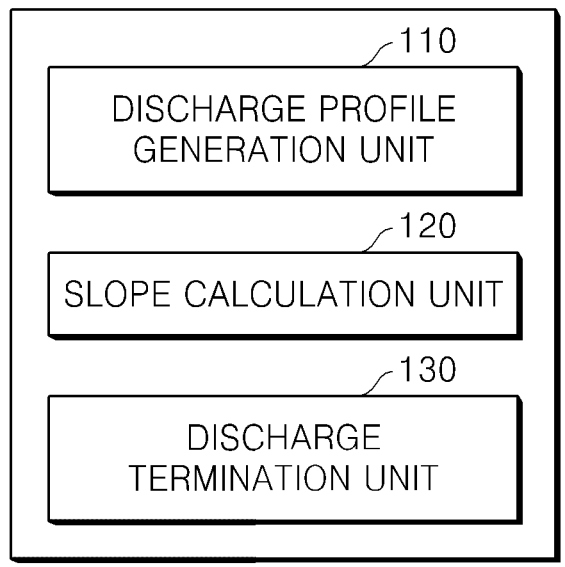
【Fig. 2】
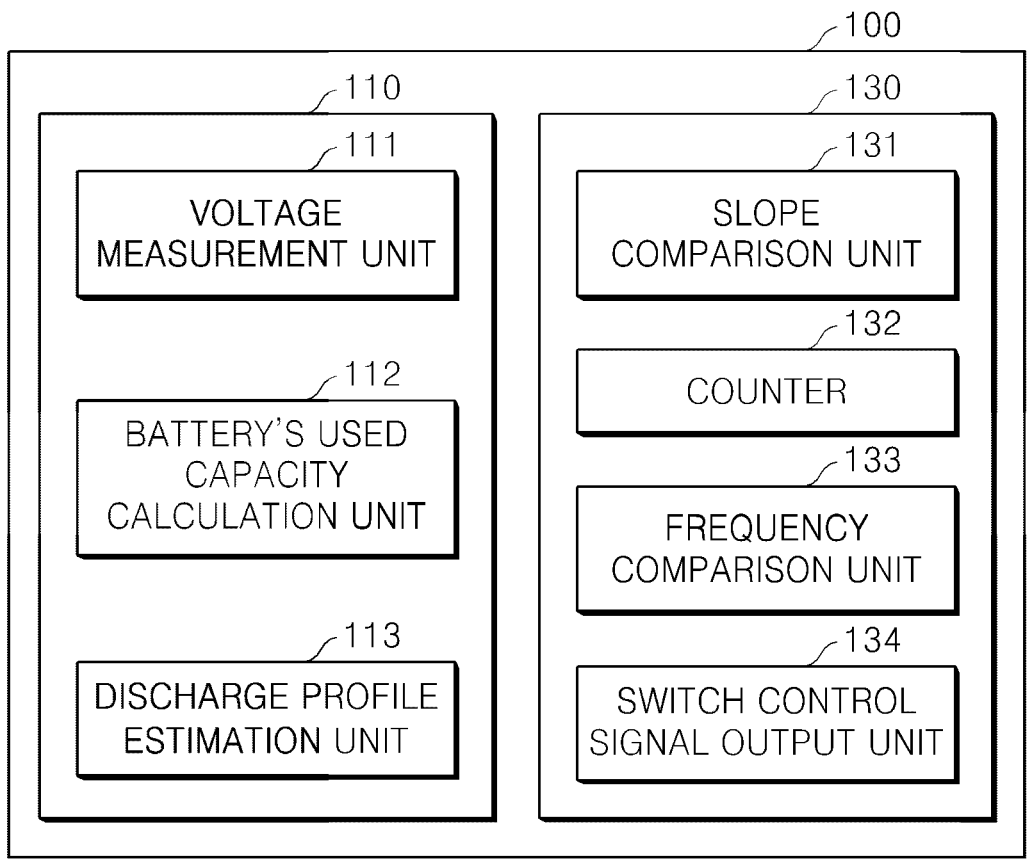

[Fig. 3]
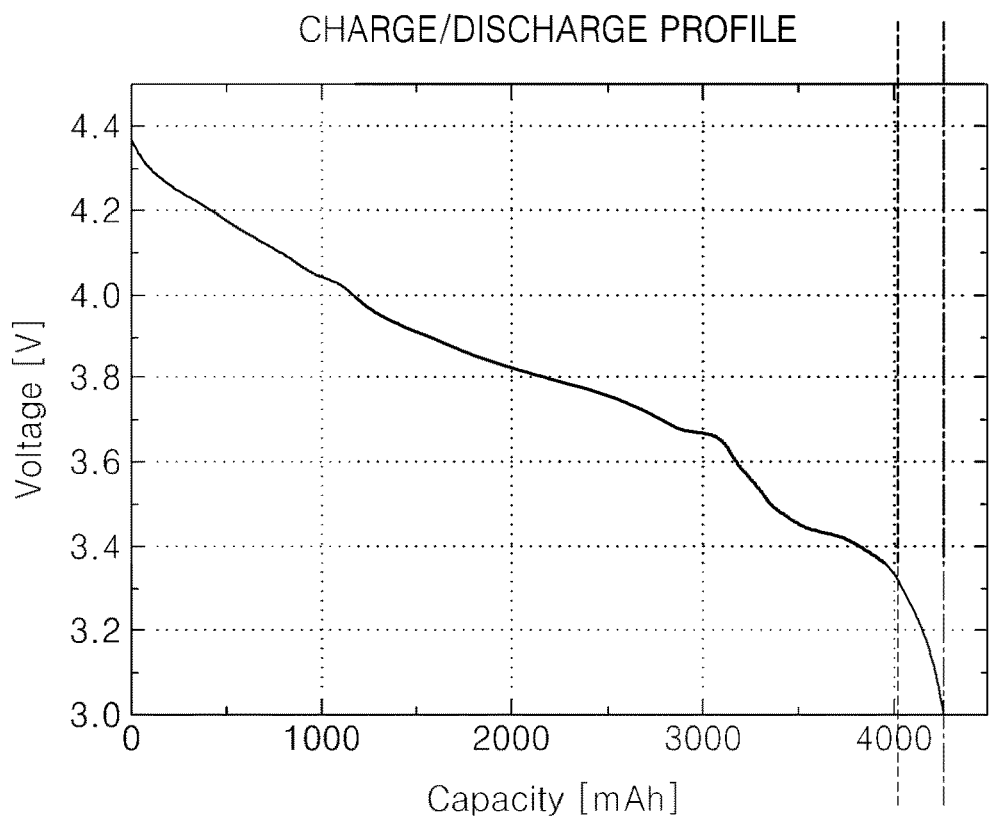
[Fig. 4]
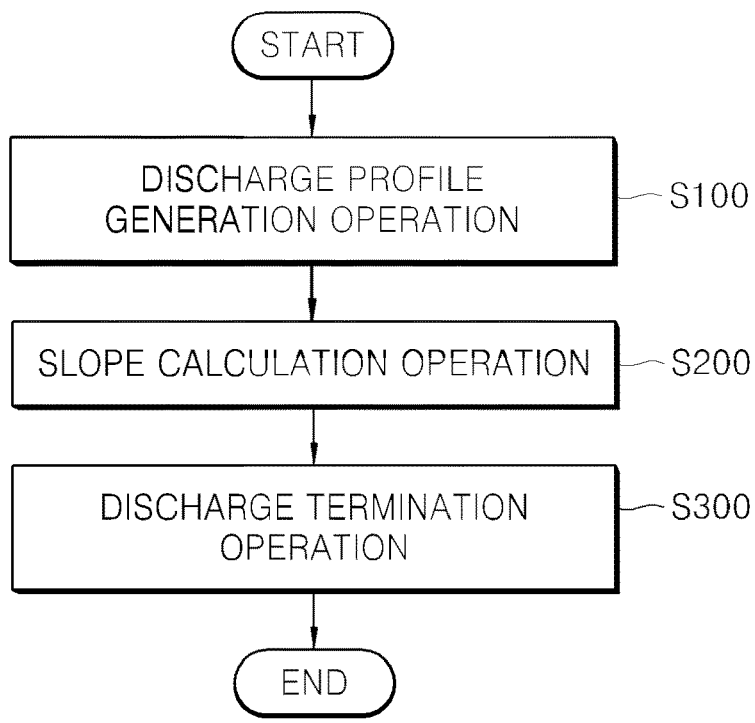

[Fig. 5]
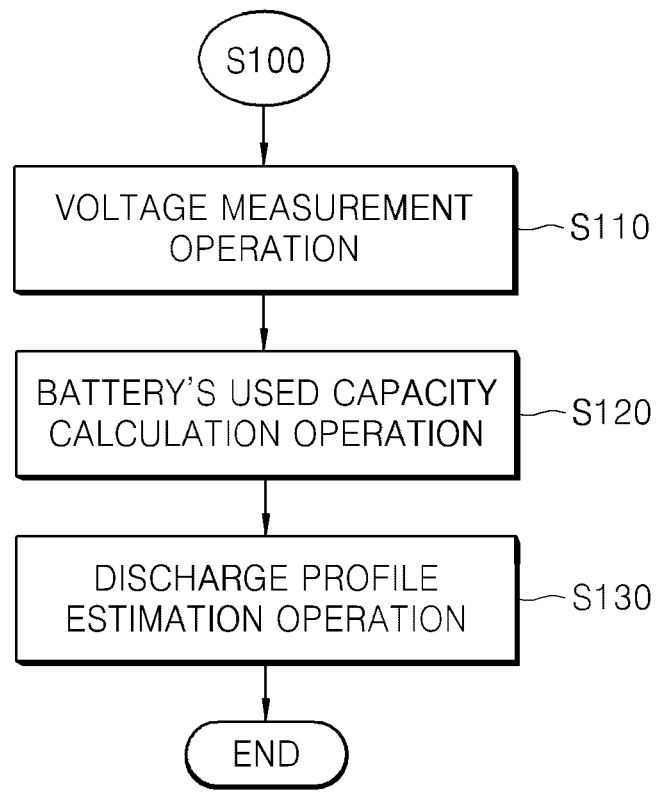
[Fig. 6]
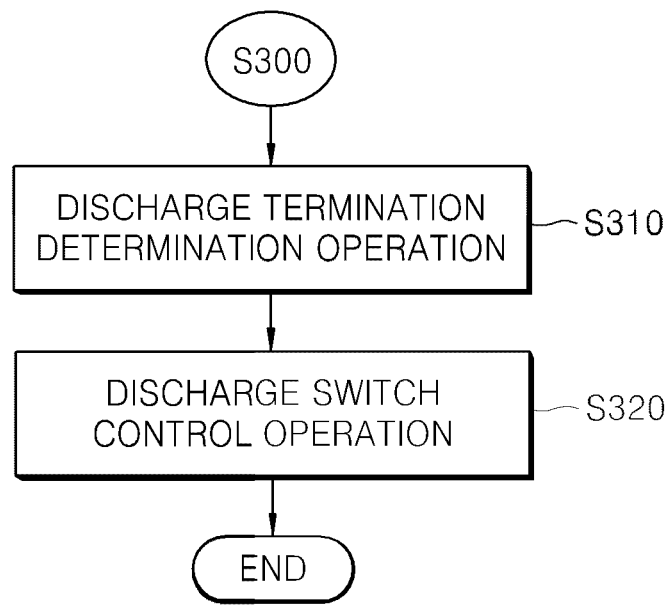

[Fig. 7]
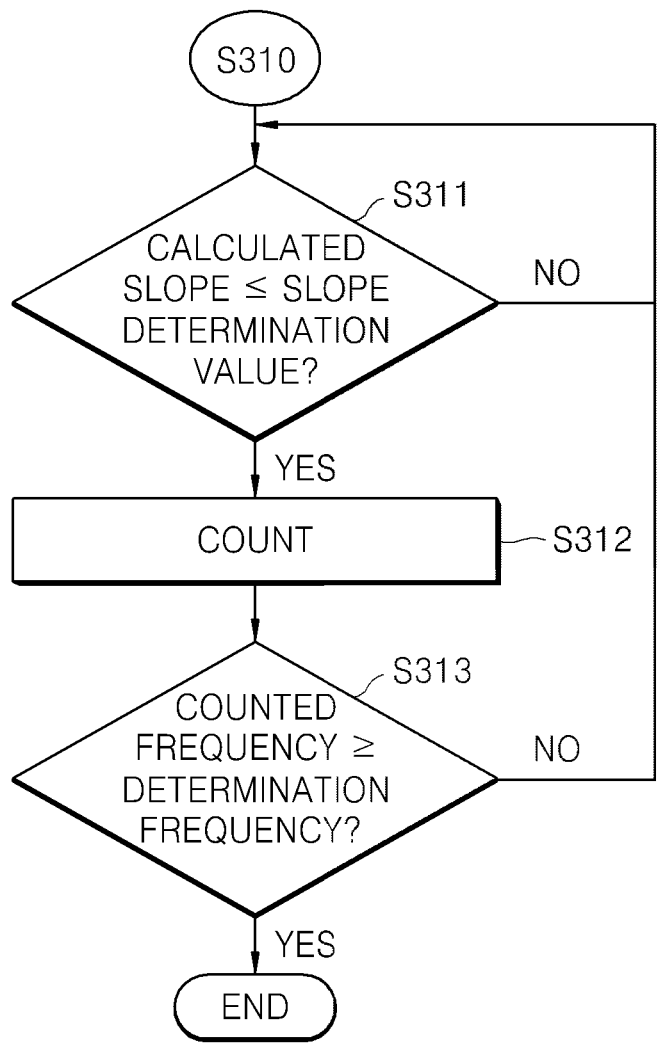

[Fig. 8]
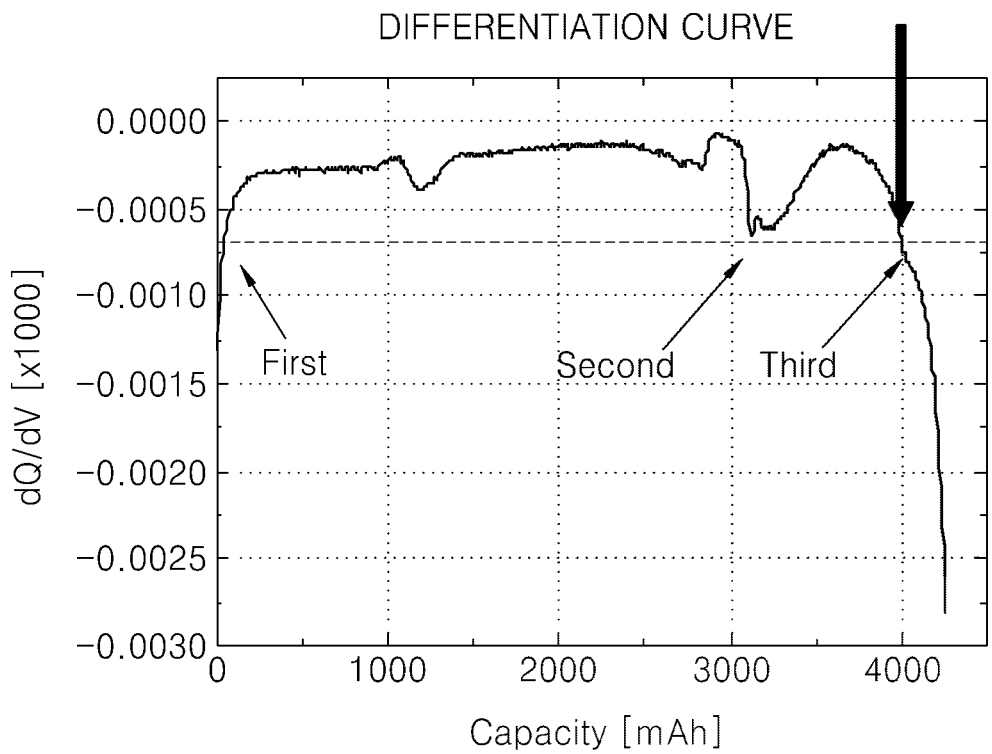
[Fig. 9]
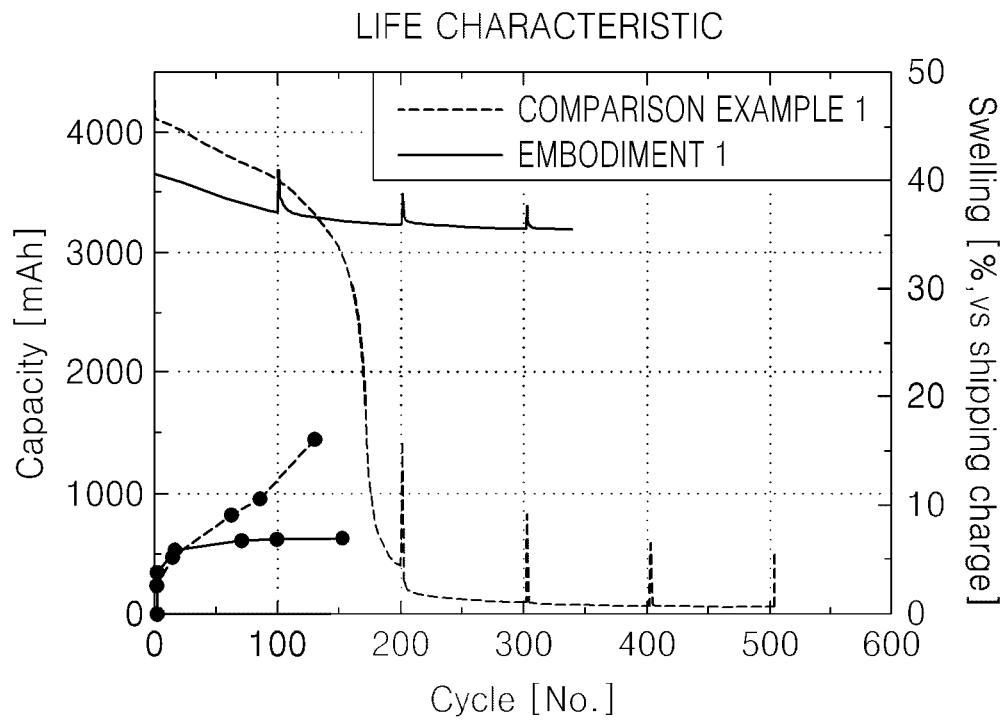

DEVICE AND METHOD FOR CONTROLLING DISCHARGE BASED ON SLOPE OF THE DISCHARGE PROFILE

TECHNICAL FIELD

The present disclosure relates to a device and method for controlling discharge, and more particularly, to a device and method for controlling discharge for adjusting a final discharge voltage in accordance with a battery to extend the life of the battery than ever.

BACKGROUND ART

A current lithium ion battery has characteristics of a high operating voltage, a long service life, a small volume and a high energy density, and is widely used for a mobile communication device, a digital camera, and a laptop, etc.

Furthermore, the lithium ion battery has a structure of a cathode, a separator, and an anode, and the cathode and anode are composed of active materials with different components coated thereon so as to be chargeable/dischargeable.

As a typical cathode active material, lithium-based oxides such as $LiCoO_2$ and $LiMn_2O_4$ are mainly used, and as a typical anode active material, a graphite-based active material is mainly used in accordance with high stability and reversibility.

However, a current battery capacity of the graphite-based active material theoretically reaches near maximum capacity and thus does not meet wide demands for miniaturizing various mobile devices and for a battery of high energy density and high power density.

In order to such problem, a silicon-based active material having a high storage capacity is widely investigated as an anode cell material.

However, for a silicon-based active material, volume expansion occurs upon being fully charged, and a dead active material is generated which does not participate in cell reaction, as a contact between active materials decreases upon being discharged. The dead active material generated at the time of discharge causes a reduction in battery life, as a charge/discharge cycle is repeated.

In this way, when a silicon-based active material is used as an anode cell material of a battery, it is desirable to develop a technology having a good life characteristic in repetition of the charge/discharge cycle.

PRIOR ART DOCUMENT

[Patent Document]
(Patent Document 1) KR2016-0020426 A

DISCLOSURE OF THE INVENTION

Technical Problem

The present disclosure provides a device and method for controlling discharge for enhancing a life characteristic of a battery with a silicon-based active material on an anode.

Technical Solution

In accordance with an exemplary embodiment, a device for controlling discharge for terminating a discharge of a battery according to a discharge profile, includes: a discharge profile generation unit configured to generate a discharge profile of the battery; a slope calculation unit configured to calculate a slope of the discharge profile generated by the discharge profile generation unit; and a discharge termination unit configured to perform discharge termination on a basis of the slope calculated by the slope calculation unit.

The discharge profile generation unit may include: a voltage measurement unit configured to measure a voltage of the battery; a battery used capacity calculation unit configured to calculate a used capacity from a full charge state of the battery on a basis of a state of charge (SOC) of the battery; and a discharge profile estimation unit configured to estimate the discharge profile on a basis of the voltage measured by the voltage measurement unit and the used capacity calculated by the battery used capacity calculation unit.

The discharge termination unit may include: a slope comparison unit configured to compare the slope calculated by the slope calculation unit with a preset slope determination value; a counter configured to count a frequency that the calculated slope is equal to or smaller than the slope determination value according to a comparison result from the slope comparison unit; a frequency comparison unit configured to compare whether the frequency counted by the counter is equal to or greater than a preset determination frequency; and a switch control signal output unit configured to output a turn-off command signal to a discharge switch, when the counted frequency is equal to or greater than the preset determination frequency, according to a comparison result from the frequency comparison unit.

In accordance with another exemplary embodiment, a method for controlling discharge for terminating a discharge of a battery in accordance with a discharge profile, includes: a discharge profile generation operation for generating a discharge profile of the battery; a slope calculation operation for calculating a slope of the discharge profile generated in the discharge profile generation operation; and a discharge termination operation for determining whether to terminate the discharge on a basis of the slope value calculated in the slope calculation operation and terminating the discharge.

The discharge profile generation operation may include: a voltage measurement operation for measuring a voltage of the battery; a battery used capacity calculation operation for calculating a used capacity from a full charge state of the battery on a basis of an SOC of the battery; and a discharge profile estimation operation for estimating the discharge profile on a basis of the voltage measured in the voltage measurement operation and the used capacity calculated in the battery used capacity calculation operation.

The discharge termination operation may include: a discharge termination determination operation for comparing the slope value calculated in the slope calculation operation with a preset slope determination value to determine whether to terminate the discharge; and a discharge switch control operation for controlling a discharge switch to be off, when the discharge termination is determined in the discharge termination determination operation.

The discharge termination determination operation may include: a slope comparison operation for comparing the slope value calculated in the slope calculation operation with a preset slope determination value; a count operation for operating a discharge termination counter, when the calculated slope is equal to or smaller than the preset slope determination value according to a comparison result from the slope comparison operation; and a frequency comparison operation for comparing whether a counted frequency from the discharge termination counter is equal to or greater than a preset determination frequency.

In accordance with yet another exemplary embodiment, a method for controlling discharge for terminating a discharge of a battery in accordance with a discharge profile, includes: a discharge termination control determination operation for determining whether to perform a discharge termination control on a basis of a voltage of the battery; a slope calculation operation for calculating a slope of the discharge profile, when the discharge terminal control is determined to be required in the discharge termination control determination operation; and a discharge termination operation for determining whether to terminate the discharge on a basis of the slope value calculated in the slope calculation operation and terminating the discharge.

The discharge termination control determination operation may include: a voltage measurement operation for measuring a voltage of the battery; and a voltage comparison operation for comparing the voltage measured in the voltage measurement operation with a preset reference voltage value.

The discharge termination operation may include: a slope comparison operation for comparing the slope value calculated in the slope calculation operation with a preset slope determination value; and a discharge switch control operation for controlling a discharge switch to be off, when the slope value calculated in the slope comparison operation is equal to or smaller than the slope determination value according to a comparison result in the slope comparison operation.

Advantageous Effects

A device and method for controlling discharge in accordance with an embodiment of the present disclosure may control a discharge to be fluidly terminated through a slope change in discharge profile at the time of discharge, and thus reduce generation of a dead active material that is generated by full discharge and enhance the battery life characteristic having been decreased by the dead active material.

BRIEF DESCRIPTION OF THE DRAWINGS

FIG. 1 is a block diagram of a device for controlling discharge in accordance with an exemplary embodiment;

FIG. 2 is a block diagram of a discharge profile generation unit and a discharge termination performing unit in a device for controlling discharge in accordance with another exemplary embodiment;

FIG. 3 shows a discharge profile graph;

FIG. 4 is a flowchart of a method for controlling discharge in accordance with an exemplary embodiment;

FIG. 5 is a flowchart of a discharge profile generation operation in a method for controlling discharge in accordance with exemplary embodiment;

FIG. 6 is a flowchart of a discharge termination operation in a method for controlling discharge in accordance with still exemplary embodiment;

FIG. 7 is a flowchart of a discharge termination determination operation in a method for controlling discharge in accordance with still exemplary embodiment;

FIG. 8 shows a discharge profile slope graph in a method for controlling discharge in accordance with still exemplary embodiment; and FIG. 9 shows a life characteristic of a battery that performs a method for controlling discharge in accordance with still embodiment, and a typical battery life characteristic.

DETAILED DESCRIPTION OF EMBODIMENTS

Hereinafter, embodiments of the present invention will be described in detail with reference to the accompanying drawings. However, the present invention is not restricted or limited by the embodiments. Rather, the embodiments are provided so that the disclosure of the present invention is thorough and complete and fully conveys the scope of the present invention to those skilled in the art.

The term "first", "second" or the like may be used for describing various elements but does not limit the elements. Such terms are only used for distinguishing one element from other elements. For example, without departing the scope of the present invention, a first element may be referred to as a second element, and likewise, a second element may be referred to as a first element. The terminology used herein is not for delimiting the present invention but for describing specific embodiments. The terms of a singular form may include plural forms unless otherwise specified.

The terms used herein have been selected from among general terms that are widely used at the present time in consideration of the functions of the present invention, but may be changed depending on intentions of those skilled in the art, judicial precedents, or the advent of new technology. Furthermore, specific terms have been arbitrarily selected by the applicant, and the meanings of such terms will be described in detail in relevant sections of the description. Therefore, it should be understood that the terms used herein should not be simply defined literally but should be defined on the basis of the meanings of the terms and the overall contents of the present disclosure.

Embodiment 1

Hereinafter, a description will be provided about a device for controlling discharge in accordance with an exemplary embodiment.

The device for controlling discharge in accordance with the exemplary embodiment calculates a slope of a discharge profile and controls a discharge to be terminated to enable the discharge to be fluidly terminated in accordance with a discharge state, when a value of the calculated slope corresponds to a preset reference.

FIG. 1 is a block diagram of a device for controlling discharge in accordance with an exemplary embodiment.

In relation to FIG. 1, a device for controlling discharge 100 in accordance with an embodiment of the present disclosure includes a discharge profile generation unit 110 configured to generate a discharge profile on the basis of a voltage of a battery at the time of discharge, a slope calculation unit 120 configured to calculate a slope of the discharge profile generated by the discharge profile generation unit 110, and a discharge termination unit 130 configured to terminate a discharge on the basis of a slope calculated by the slope calculation unit 120.

In addition, the device for controlling discharge 100 may be used only in a case where an initial efficiency of the cathode is larger than that of the anode, and only in a case where a component of an anode material is limited to a graphite+silicon-based blending system.

Furthermore, each configuration of the device for controlling discharge will be described in detail.

The discharge profile generation unit 110 has a configuration for generating a discharge profile on the basis of a battery voltage for each preset period and will be described in detail in relation to FIG. 2.

FIG. 2 is a block diagram of a discharge profile generation unit and a discharge termination unit in a device for controlling discharge in accordance with another exemplary embodiment.

In relation to FIG. 2, the discharge profile generation unit 110 includes a voltage measurement unit 111 configured to measure a battery voltage, a battery's used capacity calculation unit configured to calculate a battery's used capacity based on a state of charge (SOC) of the battery; and a discharge profile estimation unit 113 configured to estimate a discharge profile on the basis of a used capacity calculated by the battery's used capacity calculation unit 112.

In detail, the voltage measurement unit 111 is to measure the battery voltage and a voltage value is sensed through a voltage sensor for each preset measurement period.

Accordingly, the voltage measurement unit 111 may receive a battery voltage through a pre-configured measurement unit in a battery management system (BMS) of the battery without connection with a separate voltage sensor.

The battery's used capacity calculation unit 112 calculates a used capacity from a full charge state of the battery in the same period as the voltage measurement period of the voltage measurement unit 111 on the basis of the SOC of the battery.

The SOC may be calculated by one of a current accumulation method for accumulating a charge/discharge current, an electrochemical modeling method for representing a chemical reaction inside a cell in a molecular unit, a mathematical method for representing an operation time and dynamic behavior of the SOC of the battery with a purely mathematical experimental equation, and a voltage modeling method using a relationship between an open circuit voltage (OCV) and the SOC. The SOC may be obtained using an SOC calculation unit pre-configured in the BMS of the battery.

The discharge profile estimation unit 113 has a configuration for estimating a discharge profile to generate the discharge profile on the basis of the voltage measured by the voltage measurement unit 111 and the used capacity calculated by the battery's used capacity calculation unit 112, and generates a discharge profile with a voltage reduction amount according to the battery's used capacity.

The discharge profile generated in this way may be expressed as in FIG. 3.

FIG. 3 shows the discharge profile graph.

In relation to FIG. 3, as the battery's used capacity becomes greater, the battery voltage decreases. A right side dotted line shows a time when a typical discharge is terminated, and a left side solid line shows a time when a discharge according to an exemplary embodiment is terminated. This means that a discharge time is efficiently adjusted in accordance with a use amount of silicon in the present disclosure, and to this end, the discharge time may be determined by calculating the slope of the discharge profile.

Accordingly, the slope calculation unit 120 has a configuration for calculating the slope of the discharge profile generated by the discharge profile generation unit 110, and generates the slope in accordance with a profile generated for each preset period.

In detail, a method for calculating the slope is to differentiate a measured voltage value of the battery in accordance with the battery's used capacity, and the slope is calculated by dividing a variation amount of the battery voltage by a variation amount of the battery's used capacity.

Furthermore, such a slope calculation is performed with a battery material. When lithium charged in silicon is fully extracted and entirely returned to the cathode, the volume of an active material is greatly reduced and thus connection between active materials is reduced to generate a dead active material.

In addition, as the dead active material is more generated, a charge/discharge efficiency decreases and the life is reduced.

Such a limitation may be prevented by limiting use of silicon to a proper level, and the use amount of silicon may be known through the slope of the discharge profile. Therefore, the slope of the discharge profile is calculated to figure out the use amount of silicon.

The discharge termination unit 130 has a configuration for terminating a discharge on the basis of the slope calculated by the slope calculation unit 120, and a description thereabout will be provided with reference to FIG. 2.

In relation to FIG. 2, the discharge termination unit 130 includes: a slope comparison unit 131 configured to compare the slope calculated by the slope calculation unit 120 with a preset slope determination value; a counter 132 configured to count a frequency that according to a comparison result from the slope comparison unit 131, the calculated slope is equal to or smaller than the slope determination value; a frequency comparison unit 133 configured to compare a frequency counted by the counter 132 is equal to or greater than a preset determination frequency; a switch control signal output unit 134 configured to output a turn-off command signal to a discharge switch, when the counted frequency is equal to or greater than a preset determination frequency, according to a comparison result from the frequency comparison unit 133.

In detail, the slope comparison unit 131 compares the slope calculated by the slope calculation unit 120 using a slope determination value stored in a memory that is additionally included in the discharge termination unit 130.

Here, as the memory, a memory externally or internally provided in the BMS in advance or a memory separately provided in the device for controlling discharge may be used.

In the memory, the determination frequency, which is a reference value for comparing the frequency counted by the counter 132, is also stored.

The preset slope determination value may be set to, for example, −0.7 to enable a proper discharge termination control to be performed.

The counter 132 counts the frequency that the calculated slope value is equal to or smaller than the slope determination value according to a comparison result from the slope comparison unit 131.

For example, when the slope calculated by the slope calculation unit 120 is −0.5, the calculated slope exceeds the preset slope determination value of −0.7 and thus counting is not performed. When the calculated slope is −0.73, the calculated slope is smaller than the preset slope determination value and thus counting is performed.

The frequency comparison unit 133 is to determine whether the frequency counted by the counter is equal to or greater than the preset determination frequency, and sets the preset determination frequency to, for example, 3.

This value is derived through a discharge profile differentiation curve of the battery formed from a silicon-based active material.

When the counted frequency is equal to or greater than the preset determination frequency, according to the comparison result from the frequency comparison unit, the switch control signal output unit 134 outputs a turn-off command signal to the discharge switch. In detail, in order to turn off the discharge switch, the switch control signal output unit 134 is electrically connected to the discharge switch and directly outputs an off signal thereto, or the switch control signal output unit 134 is electrically connected to the BMS in the battery to output a discharge switch off command signal to a control unit of the BMS so as to enable the control unit to turn off the discharge switch.

Embodiment 2

Hereinafter, a description will be provided about a method for controlling discharge in accordance with an exemplary embodiment.

In the method for controlling discharge in accordance with the embodiment, a discharge profile is generated at the time of discharge, the slope of the discharge profile is calculated, and when a preset slope value is detected the prescribed number of times, discharging is terminated to enable the battery to be efficiently discharged.

FIG. 4 is a flowchart of a method for controlling discharge in accordance with still exemplary embodiment.

In relation to FIG. 4, in a battery cell manufacturing method in accordance with an exemplary embodiment, a discharge profile of a battery is generated (a discharge profile generation operation S100), and the slope of the discharge profile is calculated (a slope calculation operation S200).

Whether to terminate the discharge is determined and the discharge is terminated on the basis of the slope value calculated in the slope calculation operation S200 (a discharge termination operation S300).

In this way, the method for controlling discharge may be used only in a case where an initial efficiency of the cathode (+) is larger than that of the anode (−), and only in a case where a component of an anode material is limited to a graphite+silicon-based blending system.

In addition, each operation of the method for controlling discharge will be described in detail below.

The discharge profile generation operation S100 is an operation for generating the discharge profile on the basis of a battery voltage during discharge and will be described in detail in relation to FIG. 5.

FIG. 5 is a flowchart of the discharge profile generation operation S100 of the method for controlling discharge in accordance with still exemplary embodiment.

In relation to FIG. 5, in the discharge profile generation operation S100, the battery voltage is measured (a voltage measurement operation S110), and a capacity having been used from a full charge state of the battery is calculated on the basis of the SOC of the battery (a battery's used capacity calculation operation S120).

The discharge profile is estimated to be generated based on the voltage measured in the voltage measurement operation S110 and the used capacity calculated in the battery's used capacity calculation operation S120 (a discharge profile estimation operation S130).

In detail, in the voltage measurement operation S110, the battery voltage is measured for each preset measurement period and a voltage reduction amount may be checked. In the battery's used capacity calculation operation S120, a used capacity from the full charge state of the battery is calculated based on the SOC estimated by the BMS of the battery.

In this way, the method for calculating the battery's used capacity using the SOC estimated by the BMS of the battery may be performed by multiplying a value obtained by subtracting the estimated SOC from 100% by the total capacity of the battery (the capacity at the time of being fully charged), which is expressed as Equation (1):

$$\text{Battery's used capacity(mAh)} = \{100(\%) - SOC(\%)\} \times (\text{total capacity})(mAh) \quad (1)$$

The discharge profile estimation operation S130 is an operation for estimating the discharge profile to generate the discharge profile on the basis of the voltage measured in the voltage measurement operation S110 and the used capacity calculated by the battery's used capacity calculation operation S120. In the operation, the discharge profile is generated as a voltage change amount according to the battery's used capacity.

The slope calculation operation S200 is an operation for calculating a slope of the discharge profile generated in the discharge profile generation operation S100, and is performed to figure out a use amount of Silicon.

In detail, a method for calculating the slope is to differentiate a measured voltage of the battery in accordance with the battery's used capacity, and is calculated in a method for dividing a variation amount of the battery voltage by a variation amount of the battery's used capacity.

For example, when a voltage value in the discharge profile in a previous period is 4.2 V and a used capacity is 500 mAh, and a voltage value acquired from the discharge profile generation operation S100 in a current period is 4.06 V and a used capacity is 1000 mAh, the slope of the current period may be calculated to be −0.00028.

Furthermore, when lithium charged in silicon is fully extracted and entirely returned to the cathode during discharge, the volume of an active material is greatly reduced and thus connection between active materials is reduced to generate a dead active material.

In addition, as the dead active material is more generated, a charge/discharge efficiency decreases and the life is reduced.

Such a life reduction limitation may be prevented by limiting a use of silicon to a proper level, and the use amount of silicon may be known through the slope of the discharge profile. Therefore, the slope of the discharge profile is calculated to figure out the use amount of silicon.

The discharge termination operation S300 is an operation for terminating the discharge by determining whether to terminate the discharge on the basis of the slope value calculated in the slope calculation operation, and a detailed description thereabout will be provided with reference to FIG. 6.

FIG. 6 is a flowchart of the discharge termination operation S300 in the method for controlling discharge in accordance with still exemplary embodiment.

In relation to FIG. 6, in the discharge termination operation S300, the slope value calculated in the slope calculation operation S200 is compared with a preset slope determination value to determine whether to perform a discharge (a discharge termination determination operation S310)), and when it is determined to terminate performing of the discharge, the discharge switch is controlled to be off (a discharge switch control operation S320).

Each operation of the discharge termination operation S300 will be described in detail below.

The discharge termination determination operation S310 is an operation for comparing the slope value calculated in the slope calculation operation S200 with the preset slope determination value to determine whether to perform discharge, and will be described in detail with reference to FIG. 7.

FIG. 7 is a flowchart of the discharge termination determination operation in the battery cell manufacturing in accordance with an exemplary embodiment.

In relation to FIG. 7, in the discharge termination operation S310, the slope value calculated in the slope calculation operation S200 is compared with the preset slope determination value (a slope comparison operation S311), and when the calculated slope according to the comparison result from the slope comparison operation S311 is equal to or smaller than the slope determination value, a discharge termination counter counts (a counting operation S312).

The counting frequency of the discharge termination counter is determined to be equal to or greater than a preset determination frequency (a frequency comparison operation S313).

The discharge termination determination operation S310 will be described in detail with reference to FIG. 8, and FIG. 8 is a discharge profile slope graph in the method for controlling discharge in accordance with an exemplary embodiment.

In relation to FIG. 8, when the slope determination value in the slope comparison operation S311 is, for example, −0.7, and the slope value calculated in the slope calculation operation S200 is, for example, −0.53, the discharge termination determination operation S310 is performed again using a next slope value, since −0.53 is greater than −0.7.

When the calculated slope value is −0.74, the counting operation S312 is performed since −0.74 is smaller than −0.7.

When the determination frequency in the frequency comparison operation S313 is set to 3 as shown in FIG. 8, and the frequency counted in the counting operation S312 is 2, the discharge termination determination operation S310 is performed again using a next slope value.

When the frequency counted in the counting operation S312 is 3, the discharge switch control operation S320 is performed.

The discharge switch control operation S320 is an operation for controlling the discharge switch to be off, when it is determined to terminate the discharge in the discharge termination determination operation S310. In this operation, the discharge switch is directly connected to be directly turned off, or the control unit of the BMS for turning the discharge switch on/off is connected and a turn-off control command is output to the control unit so as to turn off the discharge switch.

In this way, the battery for which a discharge termination is controlled has an enhanced life characteristic, which will be described in detail with reference to FIG. 9.

FIG. 9 shows a life characteristic of a battery on which a method for controlling discharge is performed in accordance with an exemplary embodiment, and a typical life characteristic.

In relation FIG. 9, a solid line indicates a life characteristic of a battery on which the method for controlling discharge in accordance with an embodiment of the present disclosure is performed, and a dotted line indicates a life characteristic of a typical battery having a fixed final discharge voltage. Here, a set slope determination value is −0.7, and the determination frequency is set to 3.

The solid line indicates that a constant battery capacity is maintained despite of repetition of cycles, but the dotted line indicates that the battery capacity is reduced, as the cycles are repeated.

The dotted line also indicates that a swelling phenomenon gradually increases, but the solid line indicates that the swelling phenomenon is maintained within a prescribed range.

When a discharge termination point is flexibly adjusted in accordance with a state where a discharge is being per-formed as shown in the present disclosure, it may be seen that the life of the battery is enhanced.

Embodiment 3

Hereinafter, a description will be provided about a method for controlling discharge in accordance with another exemplary embodiment.

In the method for controlling discharge in accordance with the other exemplary embodiment, the slope of the discharge profile generated in advance is continuously calculated, when the discharge voltage drops to or below the reference voltage value, and the battery is allowed to be efficiently discharged in accordance with discharge termination, when the calculated slope value is equal to or smaller than a preset slope determination value.

In a battery cell manufacturing method in accordance with another embodiment, whether to perform a discharge control is determined on the basis of the battery voltage (a discharge termination control determination operation), and the slope of the discharge profile is calculated, when it is determined that the discharge termination control is desirable (a slope calculation operation).

Then, whether to terminate the discharge is determined on the basis of the slope value calculated in the slope calculation operation, and then the discharge is terminated (a discharge termination operation).

This method for controlling discharge may be used only in a case where an initial efficiency of the cathode (+) is larger than that of the anode, and only in a case where a component of an anode (−) material is limited to a graphite+silicon-based blending system.

In addition, each operation of the method for controlling discharge will be described in detail below.

The discharge termination control determination operation S100 is an operation for determining whether to perform the discharge control on the basis of the battery voltage. In this operation, the battery voltage is measured (a voltage measurement operation) and the measured voltage is compared with a preset reference voltage value (a voltage comparison operation).

In the voltage measurement operation, the battery voltage is measured for each preset measurement period, and then, the discharge termination control determination operation is performed until the measured voltage is reduced to the preset reference voltage value.

Accordingly, in order to more efficiently use the voltage comparison operation, an interval of a comparison period, in which the voltage comparison operation is performed, is differently formed for each voltage period of a battery.

For example, in a period (4 V period) in which the battery voltage is high, the voltage comparison operation is performed, when five voltage values measured in the voltage measurement operation are accumulated. In addition, in a period (a period equal to or greater than 3.5 V and smaller than 4 V) in which the battery voltage is proper, the voltage comparison operation is performed only when three voltage values are accumulated.

In a period (a period smaller than 3.5 V) in which the battery voltage is proper, every time the voltage value is measured, the voltage comparison operation is performed so as to efficiently perform a discharge termination control.

The reference voltage value in the voltage comparison operation is set to, for example, 3.5 V so as to allow the slope calculation operation to be performed at a voltage after the second point in FIG. 8.

The slope calculation operation is an operation for calculating the slope of the discharge profile, when it is determined that discharge termination control is required in the discharge termination control determination operation, and is performed to figuring out a use amount of silicon.

Here, as the discharge profile, a discharge profile generated in the BMS of the battery may be used or a discharge profile autonomously generated by further performing an operation for generating the discharge profile may be used.

Furthermore, a reason why the final discharge voltage for terminating the discharge is not fixed and the discharge is terminated by calculating the slope is because the volume of an active material is greatly reduced and thus connection between active materials is reduced to generate a dead active material, when lithium charged in silicon is fully extracted and entirely returned to the cathode during discharge.

In addition, as the dead active material is more generated, a charge/discharge efficiency decreases and the life is reduced.

Such a life reduction limitation may be prevented by limiting a use of silicon to a proper level, and the use amount of silicon may be known through the slope of the discharge profile. Therefore, the slope of the discharge profile may be calculated to figure out the use amount of silicon.

The discharge termination operation is an operation for determining whether to terminate the discharge on the basis of the slope value calculated in the slope calculation operation, and terminating the discharge. In the operation, the slope value calculated in the slope calculation operation is compared with a preset slope determination value (a slope comparison operation), and according to a comparison result, when the calculated slope value is equal to or smaller than the slope determination value, the discharge switch is controlled to be turned off (a discharge switch control operation).

In detail, for example, when the slope determination value in the slope comparison operation is −0.7, and the slope value calculated in the slope calculation operation is −0.53, the discharge termination determination operation is performed again using a next slope value, since −0.53 is greater than −0.7.

When the calculated slope value is −0.74, the discharge switch control operation is performed since −0.74 is smaller than −0.7.

The discharge switch control operation is an operation for controlling the discharge switch to be turned off, when the calculated slope value is equal to or smaller than the slope determination value according to the comparison result in the slope comparison operation. In the operation, the discharge switch is directly connected to be directly turned off, or the control unit of the BMS for turning the discharge switch on/off is connected and a turn-off control command is output to the control unit so as to turn off the discharge switch.

A device corresponding to the method for controlling discharge in accordance with another embodiment will be described in detail below.

The device for controlling discharge in accordance with the other embodiment includes a discharge termination control determination unit configured to determine whether to perform a discharge termination control on the basis of a battery voltage, a slope calculation unit configured to calculate a slope of a discharge profile generated in advance in accordance with a determination result from the discharge termination control determination unit, and a discharge termination unit configured to determine whether to terminate the discharge on the basis of the slope value calculated by the slope calculation unit and then terminate the discharge.

Each component of the device for controlling discharge will be described in detail. The discharge termination control determination unit is a component configured to determine whether to perform a discharge termination control on the basis of the battery voltage, and includes a voltage measurement unit configured to measure a battery voltage, and a voltage comparison unit configured to compare the voltage measured by the voltage measurement unit with a present reference voltage.

The voltage measurement unit is to measure the battery voltage, and the voltage value is sensed through a voltage sensor for each preset measurement period.

Accordingly, the voltage measurement unit may receive, only through connection with the BMS, a battery voltage through a measurement unit formed in advance in the BMS of the battery without separate connection with a voltage sensor.

In addition, the voltage comparison unit is a component configured to compare the voltage measured by the voltage measurement unit with the preset reference voltage, and performs the comparison using the reference voltage stored in a memory.

Here, as the memory, a memory externally or internally provided in advance in the BMS or a memory separately provided in the device for controlling discharge may be used.

The slope calculation unit is a component configured to calculate the slope of the discharge profile, when the discharge termination control determination unit determines the discharge termination control to be required, and figures out a use amount of silicon.

Here, as the discharge profile, a discharge profile generated in the BMS of the battery may be used or a discharge profile autonomously generated by further performing an operation for generating the discharge profile may be used.

In detail, a method for calculating the slope is to differentiate a measured voltage value of the battery in accordance with the battery's used capacity, and is calculated by dividing a variation amount of the battery voltage by a variation amount of the battery's used capacity.

The discharge termination unit includes a slope comparison unit configured to compare the slope value calculated by the slope calculation unit with a preset slope determination value, and a discharge switch control unit configured to control the discharge switch to be off, when the calculated slope value is equal to or smaller than the slope determination value according to a comparison result from the slope comparison unit.

The slope comparison unit is a component configured to compare the slope value calculated by the slope calculation unit with the preset slope determination value, and sets the slope determination value to, for example, −0.7 to enable a proper discharge termination control to be performed.

The discharge switch control unit is a component configured to control the discharge switch to be off, when the calculated slope value is equal to or smaller than the slope determination value according to the comparison result of the slope comparison unit, and directly outputs a turn-off signal to the discharge switch with the discharge switch electrically connected to a control signal output unit, or transmits a discharge switch a turn-off command signal to the control unit of the BMS so as to enable the control unit to turn off the discharge switch with the BMS in the battery electrically connected to the control signal output unit.

The present disclosure has been described using preferred embodiments. However, it is to be understood that the scope of the present disclosure is not limited to the disclosed embodiments. Therefore, it will be readily understood by those skilled in the art that various modifications and changes can be made thereto without departing from the spirit and scope of the present disclosure defined by the appended claims.

DESCRIPTION OF SYMBOLS

100: DEVICE FOR CONTROLLING DISCHARGE
110: DISCHARGE PROFILE GENERATION UNIT
111: VOLTAGE MEASUREMENT UNIT
112: BATTERY'S USED CAPACITY CALCULATION UNIT
113: DISCHARGE PROFILE ESTIMATION UNIT
120: SLOPE CALCULATION UNIT
130: DISCHARGE TERMINATION UNIT
131: SLOPE COMPARISON UNIT
132: COUNTER
133: FREQUENCY COMPARISON UNIT
134: SWITCH CONTROL SIGNAL OUTPUT UNIT

What is claimed is:

1. A device for controlling discharge for terminating a discharge of a battery having a lithium-based cathode material and a silicon-based anode cell material according to a discharge profile, comprising:
a discharge profile generation unit configured to generate a discharge profile of the battery, the discharge profile of the battery being voltage V of the battery with respect to a capacity mAh of the battery;
a slope calculation unit configured to calculate a slope of the discharge profile generated by the discharge profile generation unit; and
a discharge termination unit configured to perform discharge termination on a basis of the slope calculated by the slope calculation unit,
wherein the discharge termination unit comprises:
a slope comparison unit configured to compare the slope calculated by the slope calculation unit with a preset slope determination value;
a counter configured to count a frequency that the calculated slope is equal to or smaller than the preset slope determination value according to a comparison result from the slope comparison unit;
a frequency comparison unit configured to determine whether the frequency counted by the counter is equal to or greater than a preset determination frequency; and
a switch control signal output unit configured to output a turn-off command signal to a discharge switch in response to the counted frequency being equal to or greater than the preset determination frequency, according to a comparison result from the frequency comparison unit, in order to reduce the use of silicon and thus reduce generation of dead action material.

2. The device for controlling discharge of claim 1, wherein the discharge profile generation unit comprises:
a voltage measurement unit configured to measure a voltage of the battery;
a battery used capacity calculation unit configured to calculate a used capacity from a full charge state of the battery on a basis of a state of charge (SOC) of the battery; and
a discharge profile estimation unit configured to estimate the discharge profile on a basis of the voltage measured by the voltage measurement unit and the used capacity calculated by the battery used capacity calculation unit.

3. The device for controlling discharge of claim 1, wherein the preset slope determination value is set to −0.7.

4. A method for controlling discharge for terminating a discharge of a battery having a lithium-based cathode material and a silicon-based anode cell material in accordance with a discharge profile, comprising:
a discharge profile generation operation for generating a discharge profile of the battery, the discharge profile of the battery being voltage V of the battery with respect to a capacity mAh of the battery;
a slope calculation operation for calculating a slope of the discharge profile generated in the discharge profile generation operation;
a discharge termination operation for determining whether to terminate the discharge on a basis of the slope value calculated in the slope calculation operation and for terminating the discharge,
wherein the discharge termination determination operation comprises:
a slope comparison operation for comparing the slope value calculated in the slope calculation operation with the preset slope determination value;
a count operation for operating a discharge termination counter, when the calculated slope is equal to or smaller than the preset slope determination value according to a comparison result from the slope comparison operation; and
a frequency comparison operation for comparing whether a counted frequency from the discharge termination counter is equal to or greater than a preset determination frequency; and
outputting a turn-off command signal to a discharge switch, by a switch control signal output unit, in response to the counted frequency being equal to or greater than the preset determination frequency, according to a comparison result from the frequency comparison operation, in order to reduce the use of silicon and thus reduce generation of dead action material.

5. The method for controlling discharge of claim 4, wherein the discharge profile generation operation comprises:
a voltage measurement operation for measuring a voltage of the battery;
a battery used capacity calculation operation for calculating a used capacity from a full charge state of the battery on a basis of an SOC of the battery; and
a discharge profile estimation operation for estimating to generate the discharge profile on a basis of the voltage measured in the voltage measurement operation and the used capacity calculated in the battery used capacity calculation operation.

6. The method for controlling discharge of claim 4, wherein the discharge termination operation comprises:
a discharge termination determination operation for comparing the slope value calculated in the slope calculation operation with a preset slope determination value to determine whether to terminate the discharge; and
a discharge switch control operation for controlling a discharge switch to be off, when a discharge termination is determined in the discharge termination determination operation.

7. The method for controlling discharge of claim 4, wherein the preset slope determination value is set to −0.7.

* * * * *